(12) United States Patent
Kemerer et al.

(10) Patent No.: US 7,897,473 B2
(45) Date of Patent: Mar. 1, 2011

(54) METHOD OF MANUFACTURING A DUAL CONTACT TRENCH CAPACITOR

(75) Inventors: Timothy W. Kemerer, Essex Junction, VT (US); Jenifer E. Lary, Hinesburg, VT (US); James S. Nakos, Essex Junction, VT (US); Steven M. Shank, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 140 days.

(21) Appl. No.: 12/181,335

(22) Filed: Jul. 29, 2008

(65) Prior Publication Data

US 2010/0029055 A1    Feb. 4, 2010

(51) Int. Cl.
*H01L 21/20* (2006.01)
(52) U.S. Cl. .................. 438/386; 438/243; 438/248; 438/391; 257/E21.651
(58) Field of Classification Search ............. 438/243, 438/248, 386, 391; 257/301, 304, E21.65, 257/E21.651
See application file for complete search history.

(56) References Cited

U.S. PATENT DOCUMENTS

| | | | |
|---|---|---|---|
| 4,645,564 A | 2/1987 | Morie et al. | |
| 6,455,369 B1 | 9/2002 | Forster et al. | |
| 6,750,096 B2 | 6/2004 | Steck et al. | |
| 7,344,953 B2 | 3/2008 | Hecht et al. | |
| 7,554,148 B2* | 6/2009 | Su et al. | 257/301 |
| 2005/0110114 A1 | 5/2005 | Lu et al. | |
| 2006/0134877 A1 | 6/2006 | Goebel et al. | |
| 2007/0058458 A1 | 3/2007 | Pan | |
| 2007/0148899 A1* | 6/2007 | Kim | 438/396 |
| 2008/0048232 A1* | 2/2008 | Su et al. | 257/301 |
| 2008/0291601 A1 | 11/2008 | Roozeboom et al. | |

OTHER PUBLICATIONS

Office Action for corresponding U.S. Appl. No. 12/181,338.
Office Action for corresponding U.S. Appl. No. 12/181,343.

* cited by examiner

*Primary Examiner*—Michael S Lebentritt
*Assistant Examiner*—Daniel Whalen
(74) *Attorney, Agent, or Firm*—Anthony Canale; Roberts Mlotkowski Safran & Cole, P.C.

(57) ABSTRACT

A method of manufacturing a dual contact trench capacitor is provided. The method includes forming a first plate provided within a trench and isolated from a wafer body by a first insulator layer formed in the trench. The method further includes forming a second plate provided within the trench and isolated from the wafer body and the first plate by a second insulator layer formed in the trench.

24 Claims, 9 Drawing Sheets

METHOD OF MANUFACTURING A DUAL CONTACT TRENCH CAPACITOR

CROSS-REFERENCE TO RELATED APPLICATIONS

This application is related to U.S. Ser. Nos. 12/181,338, 12/181,343, 12/181,341 and respective, and filed on the same day and currently pending.

FIELD OF THE INVENTION

The present invention generally relates to a method of manufacturing a dual contact trench capacitor.

BACKGROUND OF THE INVENTION

Capacitors are used to store charge in integrated circuits (ICs) such as in DRAM and SRAM cells. However, the growing demand for increasingly smaller and thus more cost effective semiconductor devices, e.g., with large memory capacities, has pushed the development of miniaturized structures in sub-micron technologies. But such miniaturization has its limits. For example, the size of the capacitor becomes increasingly larger with regard to the circuit itself, thus taking up considerable chip real estate. Also, in certain applications, the capacitor can become easily disrupted due to radiation or other unwanted external charging events.

By way of example, for certain radiation hardened applications the use of a dual capacitor dual, resistor feedback has been used. These structures, though, take up a considerable amount of real estate and have not been found to be very robust to radiation events, for example. Other applications include a single capacitor and two resistor configuration which is believed to be more robust to exposure to high radiation environments such as space applications. However, this approach places additional requirements on the properties of the capacitor. In particular, both electrodes cannot be contacting any part of the silicon, either diffusion or substrate. If they are a radiation event will upset the SRAM cell, regardless of where the electrons hit the cell. For example, in a radiation environment, electron hole pairs (e.g., carriers of electric charge) will be swept to a voltage potential which, in turn, will disrupt the state of the capacitor.

Also, it is known to use MIMs in radiation and other environments. However, as technology nodes have advanced the capacitance values attainable at practical sizes have not been able to scale with the circuit requirements.

Accordingly, there exists a need in the art to overcome the deficiencies and limitations described hereinabove.

SUMMARY

In a first aspect of the invention, a method comprises forming a first plate provided within a trench and isolated from a wafer body by a first insulator layer formed in the trench. The method further comprises forming a second plate provided within the trench and isolated from the wafer body and the first plate by a second insulator layer formed in the trench.

In an additional aspect of the invention, a method comprises: forming a shallow trench isolation (STI) structure in a wafer body; forming a hole through the STI and extending into the wafer body; forming a first plate within the hole isolated from the wafer body; and forming a second plate within the hole which is independent of the first plate. The second plate is isolated from the first plate.

BRIEF DESCRIPTION OF SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The present invention generally relates to a method of manufacturing a dual contact trench capacitor. By implementing the invention, it is now possible to prevent radiation or other unwanted charging events from disrupting the capacitor. This is possible by providing isolated contacts or electrode plates in a dual contact trench capacitor arrangement. Also, the contact trench capacitor arrangement of the present invention is scalable and easily tunable with future generation devices.

Fabrication Processes

Figure 1:
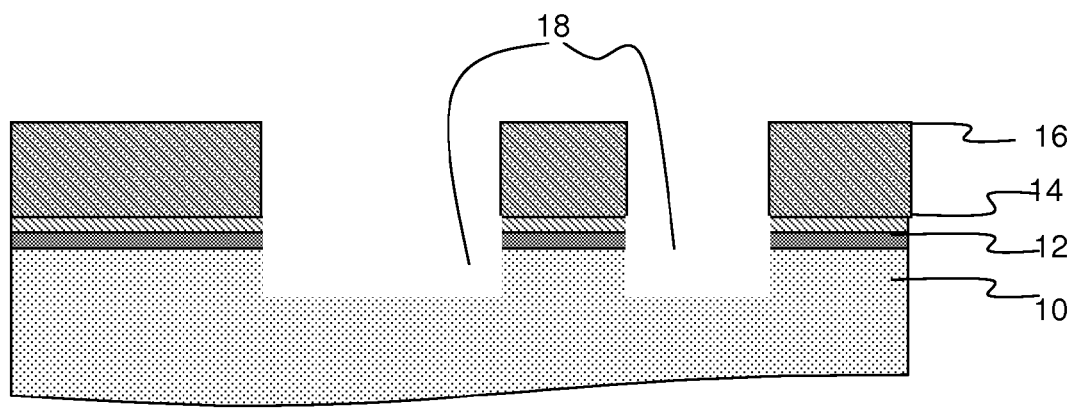
FIG. 1 represents a beginning structure and processes for fabricating the structure in accordance with an aspect of the invention.

FIG. 1 represents a beginning structure and processes for fabricating the structure in accordance with the invention. More specifically, FIG. 1 shows a silicon dioxide ($SiO_2$) layer 12 formed on a conventional substrate 10 such as silicon (e.g., wafer body). The Si wafer 10, in embodiments, may be a P type, N type or an epi wafer, depending on the particular application. In embodiments, the $SiO_2$ layer 12 is deposited on the substrate 10 in a conventional deposition process. The $SiO_2$ layer 12 can range in thickness depending on its application. More specifically, in one illustrative non-limiting example, the $SiO_2$ layer 12 can range in thickness from about 50 Å to 1000 Å and is preferably about 200 Å.

A pad layer 14, e.g., Silicon Nitride (SiN) layer, is deposited on the $SiO_2$ layer 12 in a conventional deposition process. The SiN layer 14 is preferably $Si_3N_4$ with a thickness of about 1000 Å to 1200 Å; although, other thicknesses are also contemplated by the invention. A resist 16 is selectively patterned on the layer 14 to form trenches 18 in a conventional manner such as, for example, exposing the resist 16 to a light source. For example, a mask material (not shown) may be deposited over the resist 16 at selective portions. Once the mask is formed, using conventional photolithographic processes, a hole can be opened to expose portions of the pad layer 14.

Still referring to FIG. 1, exposed portions of the pad layer 14 as well as the $SiO_2$ layer 12 and substrate 10 are etched using a conventional reactive ion etching (RIE) process to form trenches 18. More specifically, using conventional etching processes such as, for example, Reactive Ion Etching (RIE), trenches are formed in the layers 10, 12, 14. Although not shown, the RIE will also etch away the resist 16. In embodiments, the trenches will be about 2000 Å to 5000 Å deep from the surface of the substrate 10. The trenches 18, though, can be of many different depths, depending on the capacitance targets. For example, the trenches 18 can extend entirely through the substrate 10 in order to provide higher capacitance due to an increased surface area of subsequently formed plates.

Figure 2:
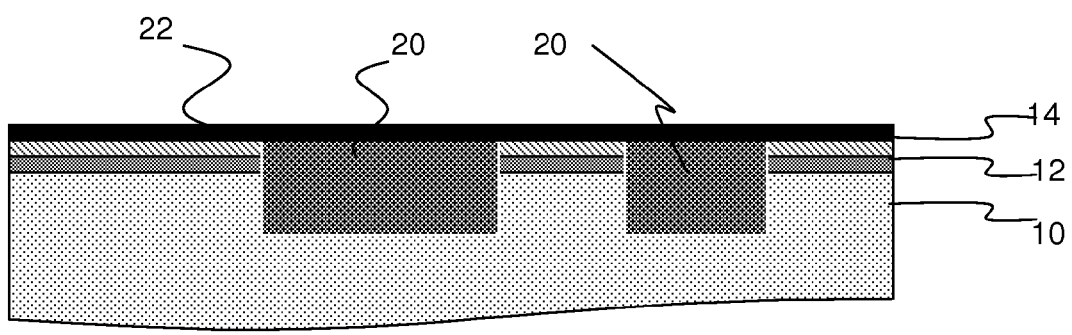
FIGS. 2-12 represent intermediate structures and respective processes for fabricating the structure in accordance with an aspect of the invention.

Referring to FIG. 2, in embodiments, the trenches 18 are filled with an oxide material to form shallow trench isolation (STI) structures 20. In embodiments, prior to the deposition of the oxide material, a thermal oxidation process may be performed to layer the sidewalls of the trenches 18 with oxide. The structure is then planarized using conventional processes such as, for example, chemical mechanical polishing (CMP) techniques. The planarization process will stop at the pad layer 14, which is used as a reference. A nitride cap 22 is then deposited over the structure. The nitride cap 22 has a thickness of about 50 Å to 1000 Å, with a preferable thickness of about 200 Å to 400 Å and a more preferable thickness of about 250 Å to 300 Å.

Figure 3:
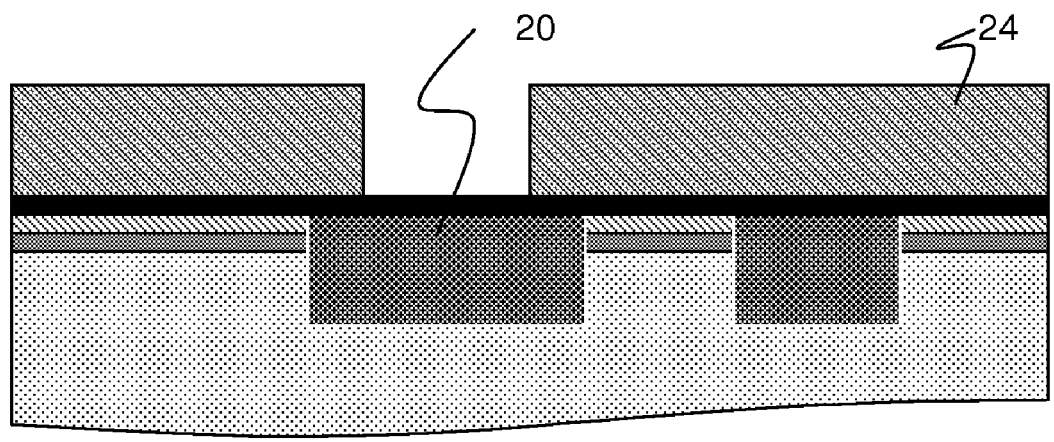

In FIG. 3, a photoresist material 24 is deposited on the structure of FIG. 2. The photoresist material 24 may be deposited using any conventional deposition process. The photoresist material 24 is aligned with the underlying STI 20.

Figure 4:
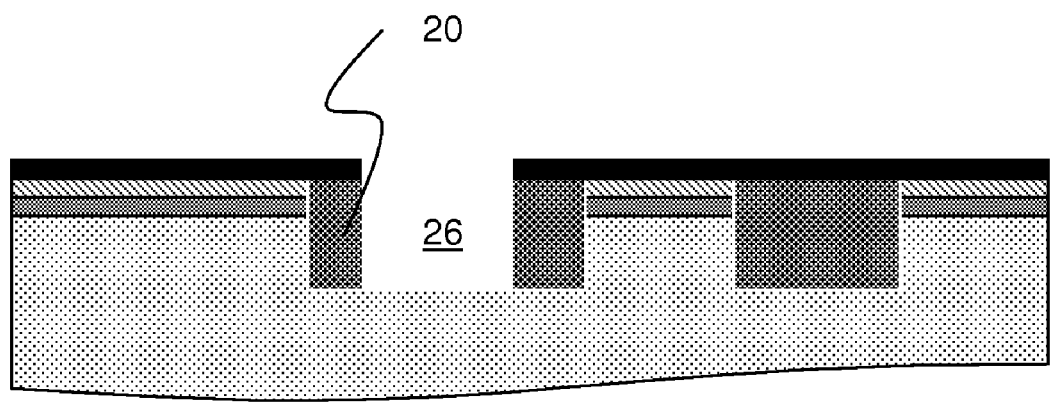
Figure 5:
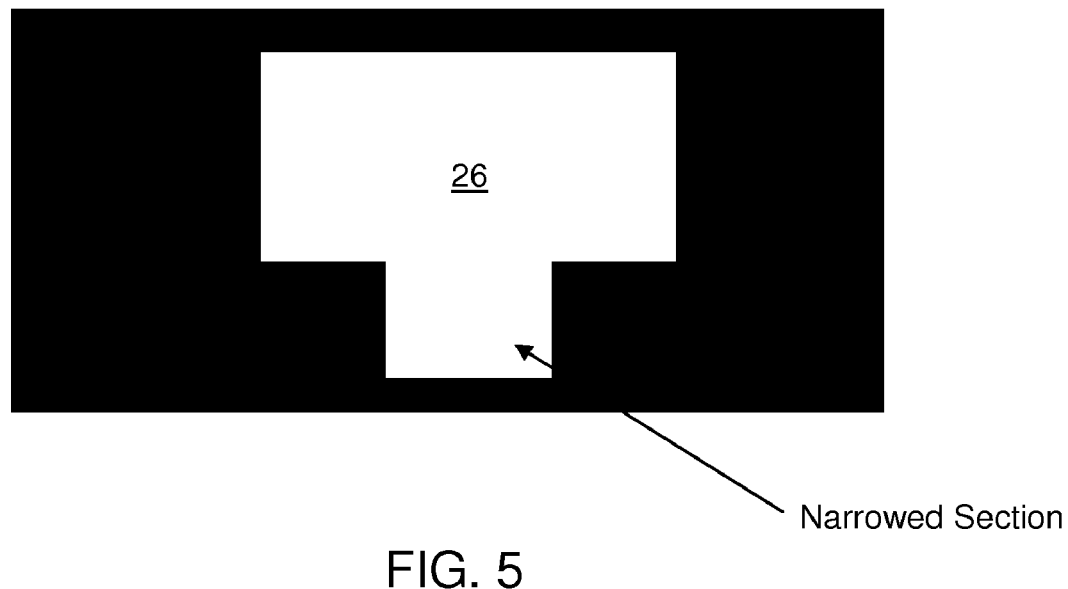

As shown in FIG. 4, a hole 26 is formed in the STI 20 using a conventional etching process. The photoresist material 24 is also removed. FIG. 5 shows a cross sectional view of the hole 26 formed in FIG. 4. As shown in FIG. 5, the shape of the hole 26 is a "T" shape, having a narrowed section. In embodiments, the narrowed section has a width of about 120 nm and preferably about 200 nm.

Figure 6:
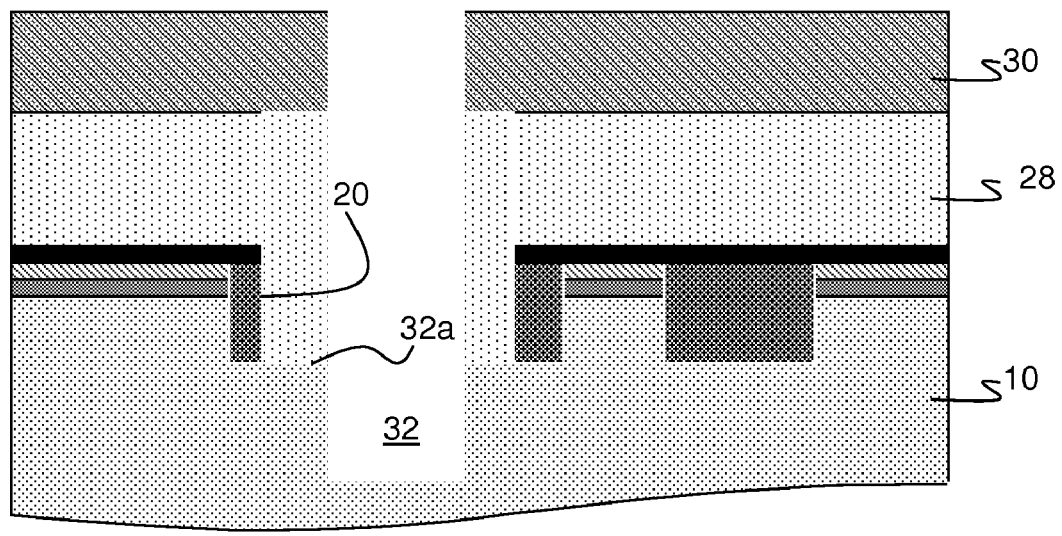

FIG. 6 shows the deposition of a BSG layer 28 and a resist layer 30 over the structure of FIG. 4. In embodiments, the BSG layer 28 is about 10,000 Å; although, it should be understood that the thickness of the BSG layer 28 can be adjusted based on the design of the device. In embodiments, a hole is opened into the resist layer 30 using a conventional lithographic process. The hole is substantially aligned with the STI 20. Using conventional etching processes, a hole 32 is patterned through the BSG layer 28 and into the substrate 10. A shoulder 32*a* is formed approximately near the junction of the STI 20 and the substrate 10. In embodiments, the hole 32 extends approximately 5 microns to 10 microns below the surface of the substrate 10.

Figure 7:
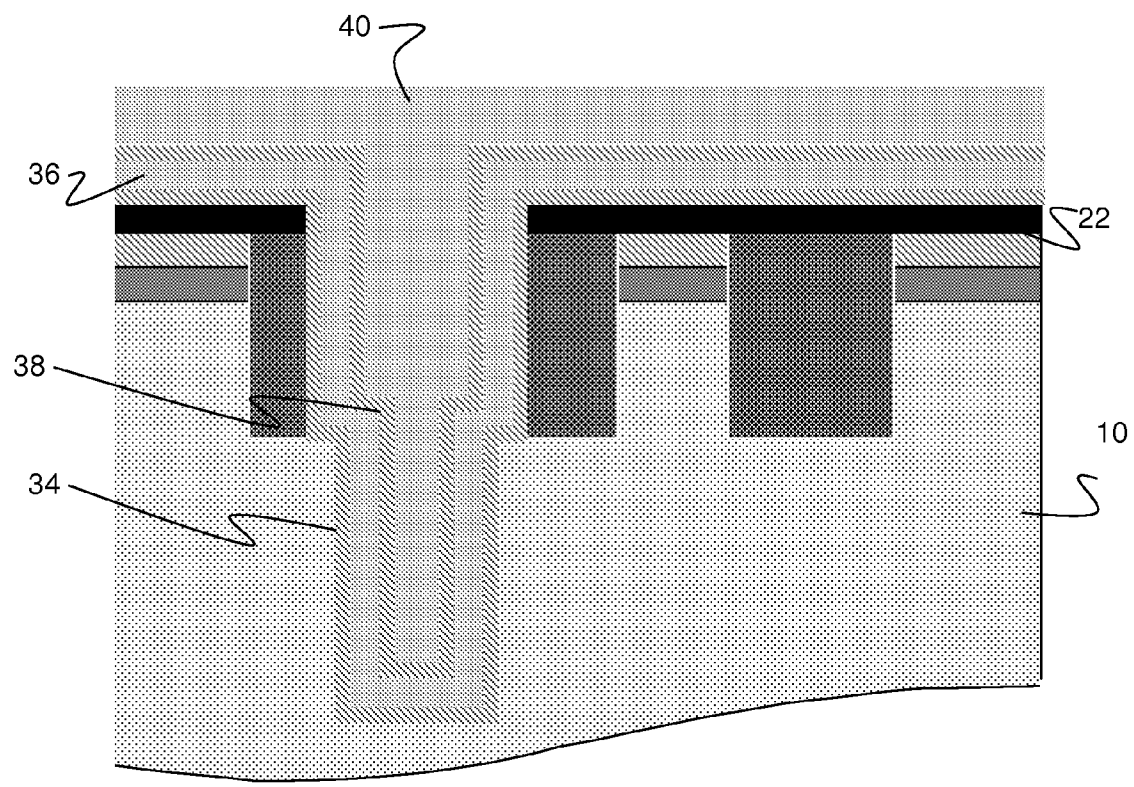

As shown in FIG. 7, the BSG layer 28 and the resist layer 30 are removed, using conventional processes. For example, in embodiments, the resist layer 30 may be removed during the etching process that formed the hole 32. The BSG layer 28 may be removed using a wet etching process, with the underlying nitride layer 22 acting as an etch stop layer.

Figure 8:
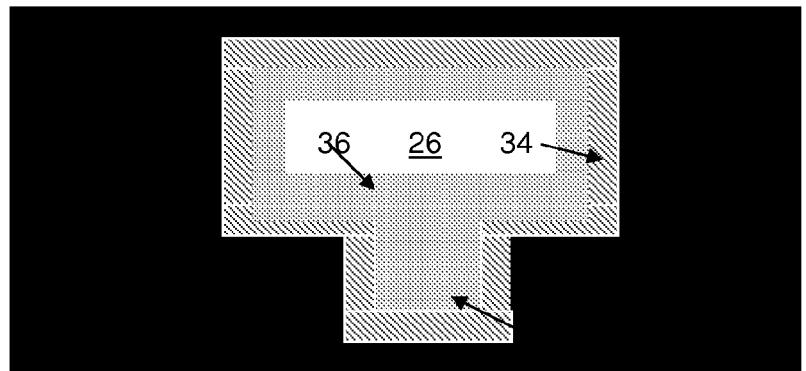

A series of layers 34, 36, 38, 40 are then deposited on the structure and preferably within the hole in a conventional manner. In particular, layer 34 is an oxide layer and more preferably an oxynitride layer. The oxynitride layer 34, in embodiments, acts as an insulator layer, insulating the substrate 10 from a poly layer 36. In embodiments, the layer 34 is about 20 nm. The layer 34 can be a thinner layer in order to provide a capacitance between the substrate 10 and the overlying poly layer 36. The poly layer 36 can be doped with arsenic and will act as a first electrode plate. The poly layer 36 can be about 100 nm and, as shown in FIG. 8, will effectively pinch off the narrowed section of the hole. The adjustment of the deposition of the layer 36 to the width of the narrow section shown in FIG. 8 provides many advantages to the present invention.

Still referring to FIG. 7, a second oxynitride layer 38 is deposited over the poly layer 36. The second oxynitride layer 38 will act as a capacitor. The oxynitride layer 38 is about 7 nm and may range from about 3 to 10 nm. A second poly layer 40 is deposited over the oxynitride layer 38. The second poly layer 40 is doped with arsenic and will act as an electrode plate to the capacitor. The second poly layer 40 is about 200 nm. In embodiments, a capacitance will be generated between the two poly layers 36, 40.

In further embodiments, the layers 36 and 40 can be a poly, metal or metal silicide or any other electrical conductor. In any scenario, these layers will form electrode plates for the capacitor. Also, in embodiments, the layer 40 will be exposed on the upper surface of the structure to form a contact region. The lower plate will be an independent electrode, isolated from the wafer body (i.e., substrate). In this manner, electron hole pairs created by, for example, radiation or other unwanted charging events, will not be swept to the first electrode as it is isolated from the wafer body. As such, the electrons hitting the wafer body will not disrupt the capacitor.

Figure 9:
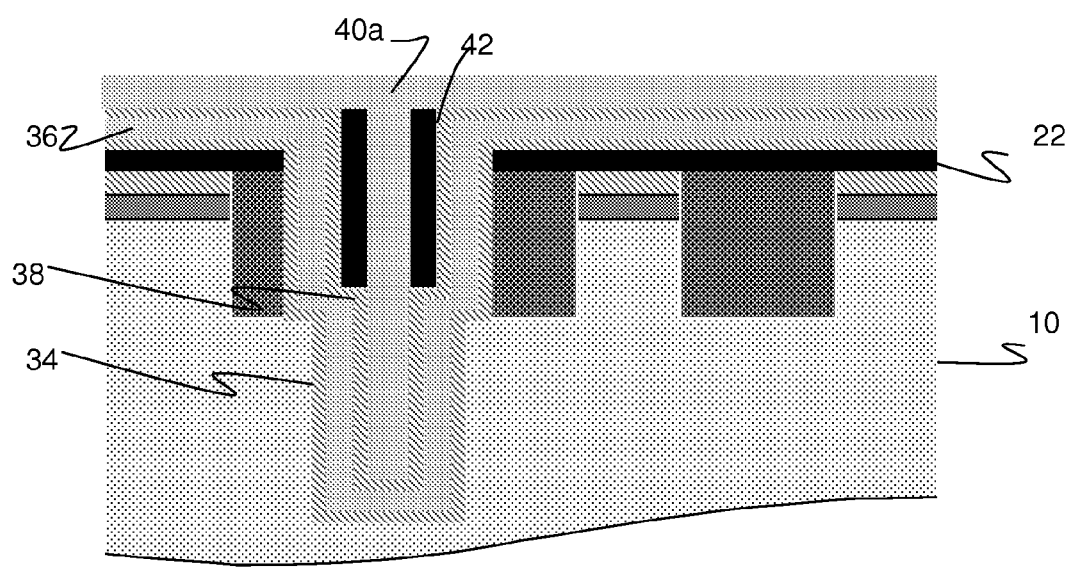

In FIG. 9, as an optional embodiment, the top layer 40 is etched back using conventional etching processes, which results in a hole. The hole is then filled with a dielectric material such as, for example, oxide. The oxide is then etched back using a conventional directional etching process to form sidewall spacers 42. The sidewall spacers 42 will add a margin to effectively eliminate any potential shorts. The open spaced between the sidewall spacers 42 is then filled with additional poly material 40*a*.

Figure 10:
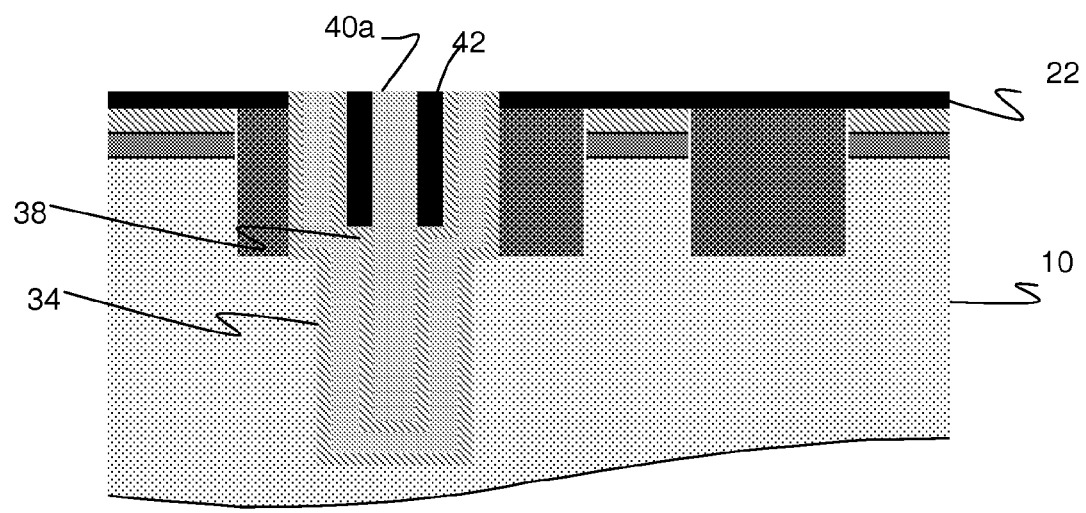
Figure 11:
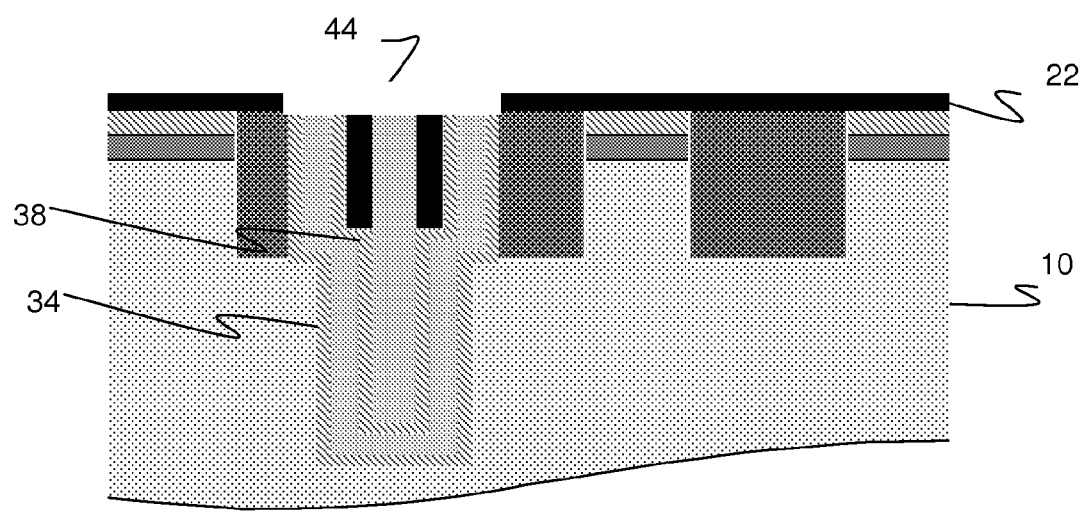

In FIG. 10, the layers 38 and 40 deposited on the nitride layer 22 are etched or polished (e.g., CMP) away using a conventional etching or polishing process. The pad nitride layer 22 acts as an etch or polish stop for this process. In FIG. 11, the layers 34, 36, 38 and 40 are etched back to form a recess 44 within the STI 20, to about half of the depth of the STI 20. In embodiments, a deglaze process using HFEG will remove the oxynitride layers 34 and 38.

Figure 12:
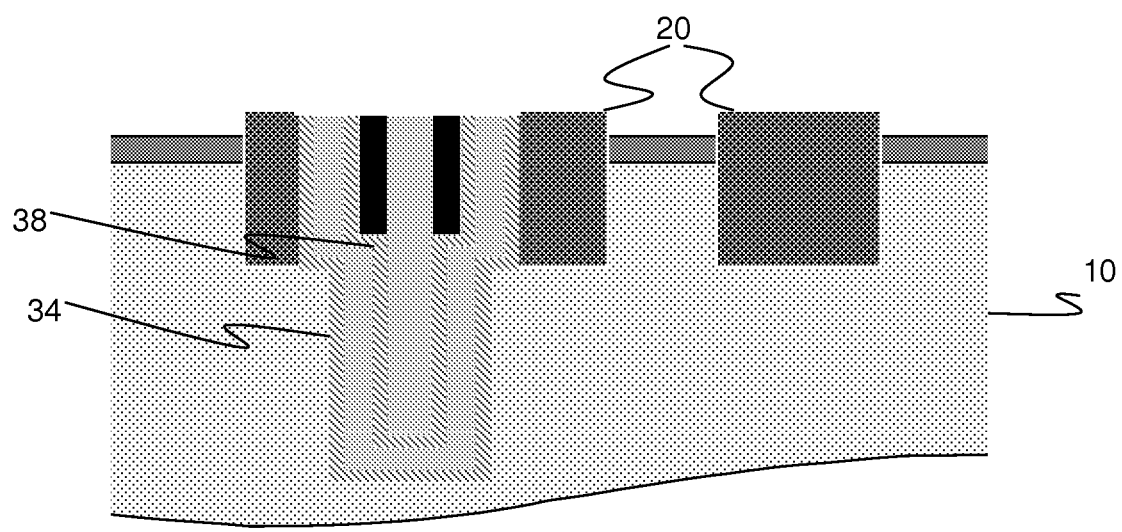

In FIG. 12, the nitride layer 22 is removed using a hot phosphoric removal process. Also, the layers 12 and 14 are removed using an HF process. The HF process will pull down the STI oxide fill, but will only slightly impact the oxynitride layers 34, 38. In embodiments, a metal material may be formed over selective portions of the poly material 36, 40 to form metal contacts.

Figure 13:
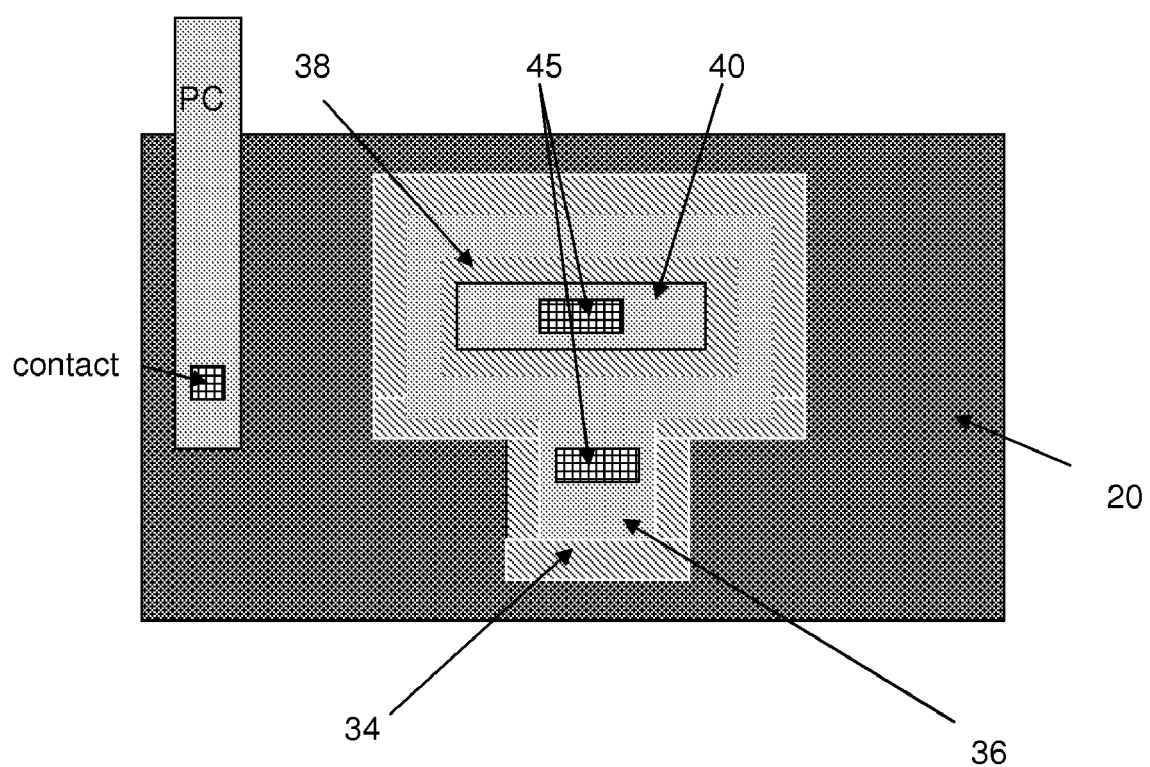
FIG. 13 represents a final structure and respective processes for fabricating the structure in accordance with the invention.

FIG. 13 shows a top sectional view of FIG. 12 with metal contacts 45. In embodiments, the contact to the first poly layer 36 may not be landed. In further embodiments, the following dimensions of the structures are contemplated, although the technology may continue to be scaled in accordance with aspects of the invention.

| Description | Size (um) |
| --- | --- |
| dimensions of poly layer 36 (L = W) | =0.40 |
| Length of hole (26) | >=0.85 |
| Width of narrowed portion (high) | =0.64 |
| Width of narrowed portion (low) | =0.21 |
| Poly layer (40) within hole (26) | >=0.12 |
| Distance between poly layer (40) to PC | >=0.10 |
| layer (40) adjacent to contact (44) | >=0.13 |
| Contact (44) within poly layer (40) | =0.14 |
| Contact (44) within narrow portion of poly layer (36) (narrow portion) | =0.045 |
| Contact (44) within narrow portion of poly layer (36) (narrow portion) | >=0.08 |

Figure 14:
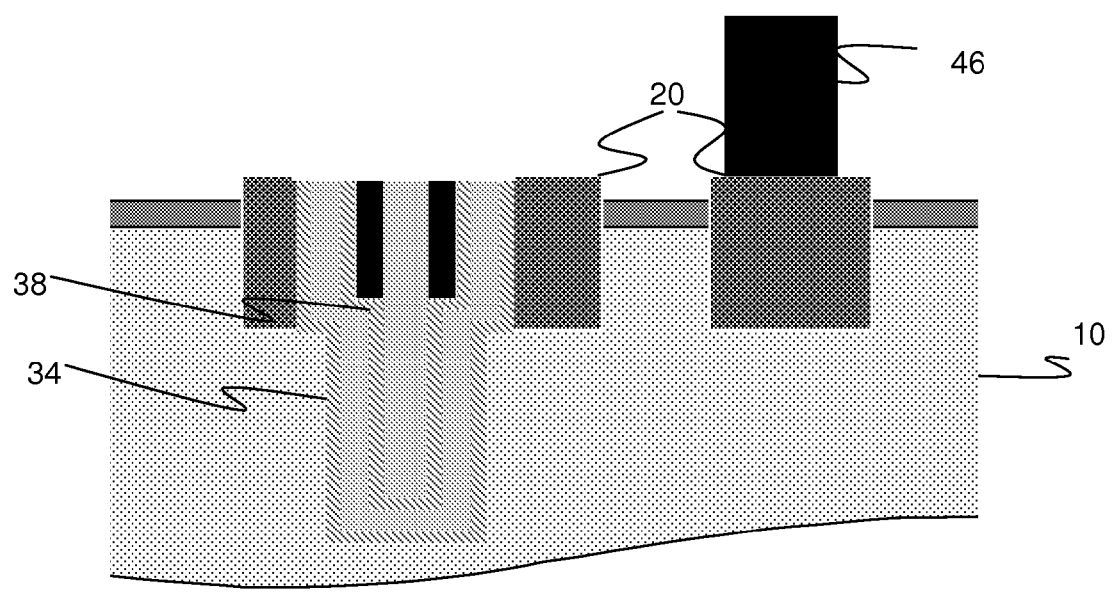
FIG. 14 represents an alternative final structure and respective processes for fabricating the structure in accordance with the invention.

FIG. 14 shows standard processing through the formation of a gate oxide structure. For example, a poly conductor material is deposited over the structure of FIG. 12 using a conformal deposition process. A resist is selectively formed over the poly conductor material. Through a conventional etching process a vertical gate structure 46 is formed from the poly conductor material. Additionally processes such as, for example, gate sidewalls and spacers can also be formed using conventional processes.

IC Product Assemblies

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed is:

1. A method comprising:
    forming a trench in a shallow trench isolation (STI) such that side walls of the trench are isolated from a wafer body by the STI;
    forming a first plate within the trench and isolated from the wafer body by a first insulator layer formed in the trench;
    forming a second plate within the trench and isolated from the wafer body and the first plate by a second insulator layer formed in the trench; and
    planarizing the first plate and the second plate by a chemical-mechanical polishing (CMP) process.

2. The method of claim 1, wherein the first plate and the second plate are formed independent from each other.

3. The method of claim 1, wherein the first plate and the second plate are formed from one of poly, metal and metal silicide.

4. The method of claim 1, wherein the first plate and the second plate are connected to contacts.

5. The method of claim 1, further comprising forming an isolation structure within the trench between the second plate and the second insulator.

6. The method of claim 1, wherein the trench is formed through the STI and extends into the wafer body.

7. The method of claim 1, wherein the first plate is formed to pinch off a portion of the trench such that the second plate is not within the pinched off portion.

8. The method of claim 1, wherein the first plate and the second plate are recessed within the trench and surrounded, at least partially, by the STI.

9. The method of claim 1, further comprising forming at least two STI structures, wherein the trench is formed in one of the STI structures.

10. The method of claim 9, wherein the STI structures are formed to protrude above a surface of the wafer body and the trench extends into the wafer body.

11. The method of claim 1, wherein the trench is scalable to increase or decrease a surface area of the first plate and the second plate thereby increasing or decreasing, respectively, a capacitance target between the first plate and the second plate.

12. The method of claim 1, wherein the first plate is formed as a stepped feature and the second plate is formed as a non-stepped feature.

13. The method of claim 1, wherein forming the second plate comprises: depositing a conductive material within a trench formed in the second insulator.

14. The method of claim 13, wherein forming the second plate further comprises:
    etching back the conductive material forming a hole;
    filling the hole with a dielectric material; and
    forming sidewall spacers within the dielectric material to form first and second isolation structures by etching.

15. The method of claim 14, wherein forming the second plate further comprises:
    filling the sidewall spacers in the dielectric material with an additional conductive material.

16. The method of claim 1, wherein the second plate is formed by a two-step conductive material deposition process.

17. A method, comprising:
    forming a shallow trench isolation (STI) in a wafer body;
    forming a first hole through the STI and extending into the wafer body;
    forming a first plate within the first hole isolated from the wafer body; and
    forming a second plate within the first hole which is independent of the first plate, the second plate being isolated from the first plate,
    wherein the first plate and the second plate are planarized by a chemical-mechanical polishing (CMP) process.

18. The method of claim 17, further comprising depositing an insulating material between the first plate and the wafer body.

19. The method of claim 17, further comprising forming contacts on exposed regions of the first plate and the second plate.

20. The method of claim 17, wherein the forming of the first plate and the second plate comprises depositing a poly material, metal or metal silicide.

21. The method of claim 17, wherein the forming of the first plate includes depositing a poly material into the first hole which pinches off a portion of the first hole such that the forming of the second plate only forms in another portion of the first hole.

22. The method of claim 17, further comprising forming an isolation structure within the trench between the second plate and a second insulator.

23. The method of claim 17, wherein the first plate is formed as a stepped feature and the second plate is formed as a non-stepped feature.

24. The method of claim 17, wherein forming the second plate comprises:

depositing a conductive material within a trench formed in the second insulator;

etching back the conductive material forming a second hole;

filling the second hole with a dielectric material;

forming sidewall spacers within the dielectric material to form first and second isolation structures by etching; and filling the sidewall spacers in the dielectric material with an additional conductive material.

* * * * *